(12) United States Patent
Chen et al.

(10) Patent No.: US 9,508,647 B2
(45) Date of Patent: Nov. 29, 2016

(54) SINGLE DAMASCENE INTERCONNECT STRUCTURE

(71) Applicant: International Business Machines Corporation, Armonk, NY (US)

(72) Inventors: Shyng-Tsong Chen, Rensselaer, NY (US); Daniel C. Edelstein, White Plains, NY (US); Takeshi Nogami, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/918,116

(22) Filed: Oct. 20, 2015

(65) Prior Publication Data

US 2016/0071802 A1    Mar. 10, 2016

Related U.S. Application Data

(62) Division of application No. 14/483,048, filed on Sep. 10, 2014, now Pat. No. 9,224,686.

(51) Int. Cl.
*H01L 23/532* (2006.01)
*H01L 23/522* (2006.01)
*H01L 21/768* (2006.01)

(52) U.S. Cl.
CPC ... *H01L 23/53238* (2013.01); *H01L 21/76802* (2013.01); *H01L 21/76843* (2013.01); *H01L 21/76855* (2013.01); *H01L 21/76877* (2013.01); *H01L 23/5226* (2013.01); *H01L 23/53295* (2013.01); *H01L 21/76834* (2013.01); *H01L 2924/0002* (2013.01)

(58) Field of Classification Search
CPC ................ H01L 23/5226; H01L 23/53238; H01L 21/76843
See application file for complete search history.

(56) References Cited

U.S. PATENT DOCUMENTS

| | | | | |
|---|---|---|---|---|
| 8,673,779 B1* | 3/2014 | Yoon | ................. | H01L 21/76883 257/E21.575 |
| 2008/0146015 A1* | 6/2008 | Usui | ................. | H01L 21/76831 438/608 |
| 2010/0038792 A1* | 2/2010 | Ochimizu | ......... | H01L 21/76807 257/758 |
| 2010/0252928 A1* | 10/2010 | Ohtsuka | ............ | H01L 21/28556 257/751 |
| 2013/0092651 A1* | 4/2013 | Bates | ................... | C09K 3/1463 216/13 |
| 2013/0127056 A1* | 5/2013 | Yun | ................... | H01L 23/53295 257/751 |
| 2013/0273733 A1* | 10/2013 | Tang | ................ | H01L 21/76843 438/643 |
| 2014/0210041 A1* | 7/2014 | Burke | ............... | H01L 23/53295 257/529 |
| 2014/0299988 A1* | 10/2014 | Cabral, Jr. | ........ | H01L 21/76846 257/751 |
| 2015/0130019 A1* | 5/2015 | Burke | ................ | H01L 23/5256 257/529 |
| 2015/0145141 A1* | 5/2015 | Uzoh | .................. | H01L 23/5384 257/774 |

* cited by examiner

*Primary Examiner* — Joseph C Nicely
(74) *Attorney, Agent, or Firm* — Law Offices of Ira D. Blecker, P.C.

(57) ABSTRACT

A single damascene interconnect structure which includes a first layer that includes a first dielectric material having a first filled opening that has a barrier layer of a refractory material with Cu filling the first filled opening. Also included is a second layer of a second dielectric material having a second filled opening that has a sidewall layer which includes a compound of a metal, O, and Si such that the metal is Mn, Ti and Al, and with Cu filling the second filled opening. The compound is in direct contact with the second dielectric material. The first layer is adjacent to the second layer and the first filled opening is aligned with the second filled opening so that the first filled opening is a via and the second filled opening is a trench.

14 Claims, 6 Drawing Sheets

SINGLE DAMASCENE INTERCONNECT STRUCTURE

RELATED APPLICATION

This application is a divisional patent application of U.S. Patent Application Ser. No. 14/483,048, filed Sep. 10, 2014, entitled "SINGLE DAMASCENE INTERCONNECT STRUCTURE", now U.S. Pat. No. 9,224,686, the disclosure of which is incorporated by reference herein.

BACKGROUND

The exemplary embodiments relate to a single damascene interconnect structure and particularly relate to a single damascene interconnect structure in which a via and a trench are formed by separate single damascene processes and only one of the via and trench has a robust refractory barrier layer such as Ta/TaN.

Integrated circuits generally comprise barrier layers at the interface between a conductive layer (typically a metal line or via in a multilayered interconnect structure) and an insulating layer (typically a dielectric layer in such a structure). These barrier layers prevent the diffusion of atoms from the conductive zone to the insulating zone, which can be the origin of integrated circuit malfunctions such as short-circuits between metal lines.

A typical method of forming a barrier layer for an integrated circuit involves forming a via and an overlay trench, by a dual damascene process, in a dielectric. The via and trench are then lined with a barrier layer of a refractory material, such as TiN, Ta, TaN or their combinations. The barrier layer serves to inhibit the diffusion of the interconnection material that will subsequently be introduced in the via and trench into the dielectric. Next, a suitable seed layer is deposited on the wall or walls of the via and trench. Suitable seed materials for the deposition of Cu interconnection material may include Cu. Interconnection material, such as Cu, is then deposited by electroplating or physical deposition in a sufficient amount to fill the via and the trench.

BRIEF SUMMARY

The various advantages and purposes of the exemplary embodiments as described above and hereafter are achieved by providing, according to a first aspect of the exemplary embodiments, a single damascene interconnect structure comprising: a first layer comprising a first dielectric material having a first filled opening, the first filled opening having a sidewall refractory barrier layer and a bottom refractory barrier layer, the sidewall refractory barrier layer being in direct contact with the first dielectric material, with Cu filling a remainder of the first filled opening; a second layer comprising a second dielectric material having a second filled opening, the second opening having a sidewall layer comprising a compound of a metal, O and Si such that the metal is selected from the group consisting of Mn, Ti and Al, and Cu filling a remainder of the second filled opening, wherein the compound of the metal O and Si is in direct contact with the second dielectric material; the first layer adjacent to the second layer and the first filled opening being aligned with the second filled opening so that the first filled opening is a via and the second filled opening is a trench.

According to a second aspect of the exemplary embodiments, there is provided a single damascene interconnect structure comprising: a first layer comprising a first dielectric material having a first filled opening, the first opening having a sidewall barrier layer in direct contact with the first dielectric material and a bottom barrier layer, the sidewall barrier layer and the bottom barrier layer selected from the group consisting of TaN, Ta, W, WN, Mo and MoN, with Cu filling a remainder of the first filled opening; a second layer comprising a second dielectric material having a second filled opening, the second filled opening having a sidewall layer in direct contact with the second dielectric material and comprising a compound of a metal, O and Si such that the metal is selected from the group consisting of Mn, Ti and Al, a Co layer on the compound of the metal, O and Si and also on a bottom of the second filled opening, and Cu filling a remainder of the second filled opening; the first layer adjacent to the second layer and the first filled opening being aligned with the second filled opening so that the first filled opening is a via and the second filled opening is a trench.

According to a third aspect of the exemplary embodiments, there is provided a method of forming a single damascene interconnect structure comprising: forming a first dielectric layer on a semiconductor substrate; forming a first opening in the first dielectric layer; forming a refractory barrier layer directly on a sidewall and a bottom of the first opening; filling a remainder of the first opening with Cu to form a first filled opening; forming a second dielectric layer on the semiconductor substrate; forming a second opening in the second dielectric layer; depositing a layer of a Cu(metal) alloy on a sidewall and a bottom of the second opening wherein the metal is selected from the group consisting of Mn, Ti and Al; filing a remainder of the second opening with Cu to form a second filled opening; reacting the Cu(metal) alloy with the second dielectric layer to form a barrier layer comprising metal, O, and Si; wherein the first dielectric layer adjacent to the second dielectric layer and the first filled opening being aligned with the second filled opening so that the first filled opening is a via and the second filled opening is a trench.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 4A to 5C illustrate a third exemplary embodiment for forming a single damascene interconnect structure in which the via has a Co liner and only the wiring line has a refractory metal barrier.

FIGS. 5A to 5C illustrate a fourth exemplary embodiment for forming a single damascene interconnect structure in which the wiring line has a Co liner and only the via has a refractory metal barrier.

DETAILED DESCRIPTION

Figure 1:
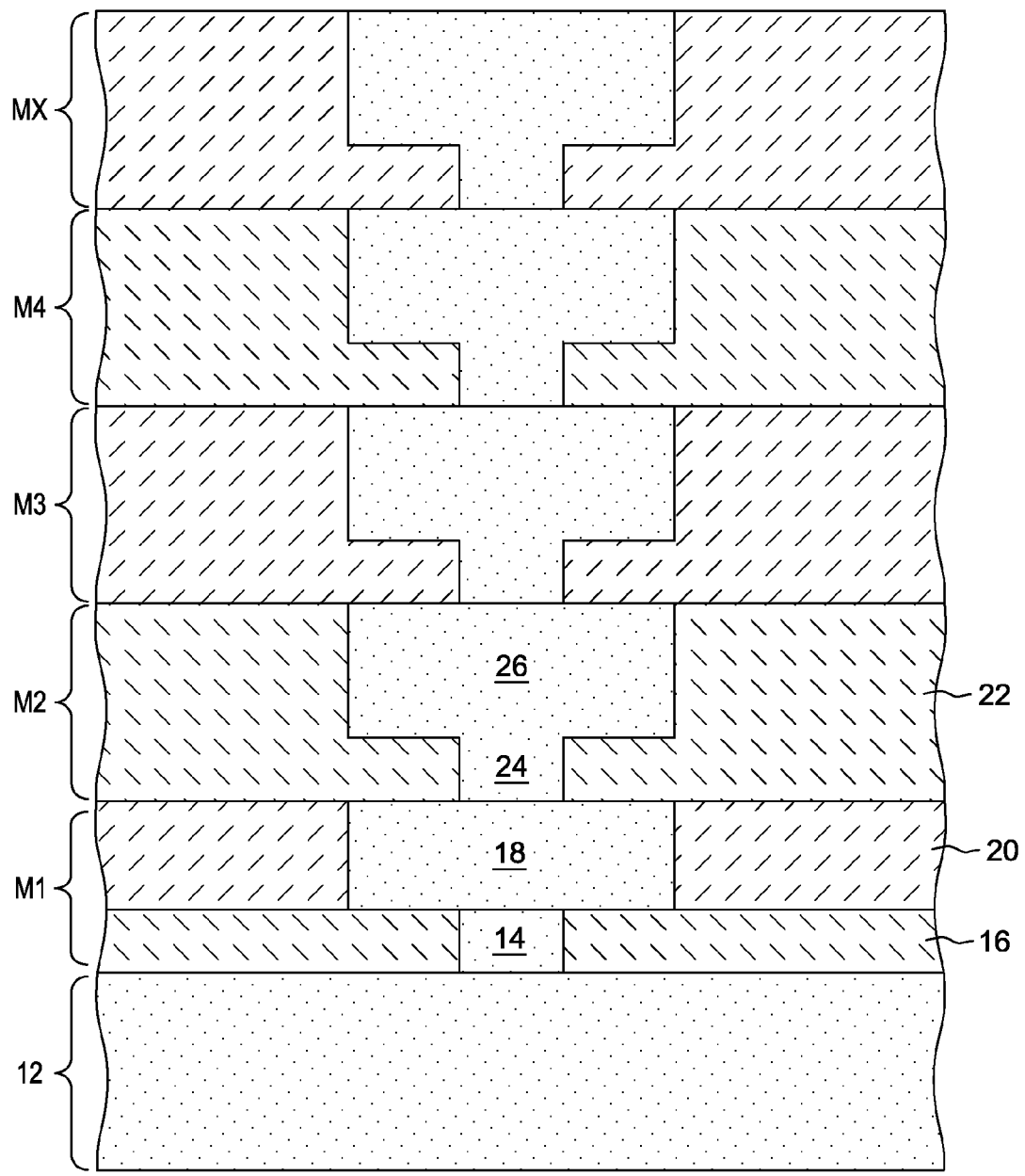
FIG. 1 is an illustration of a conventional wiring arrangement.

Referring to the Figures in more detail, and particularly referring to FIG. 1, there is shown a conventional wiring scheme 10 including a semiconductor substrate 12 (e.g., Si) on which are fabricated a plurality of metal wiring levels M1, M2, M3, M4 . . . MX. The semiconductor substrate 12 may have a plurality of semiconductor devices (not shown) which may be formed by front end of the line (FEOL) wiring processes. The plurality of metal wiring levels M1, M2, M3, M4 . . . MX may be formed by back end of the line (BEOL) wiring processes.

Wiring level M1 may be formed by a dual damascene process or single damascene process. As shown in FIG. 1, wiring level M1 has been formed by a single damascene process and comprises a via 14 in a first dielectric layer 16 followed by a wiring line (or trench) 18 in a second dielectric layer 20. As the via 14 and wiring line 18 typically comprise Cu, the via 14 and wiring line 18 may be typically lined with a barrier layer (not shown) of a refractory metal or combination of refractory metals, such as TaN/Ta.

The subsequent wiring levels may be formed by a dual damascene process in which a via and wiring line are formed in a single layer of dielectric. Wiring level M2, for example, includes a single dielectric layer 22 in which via 24 and wiring line 26 may be formed by a dual damascene process. In a dual damascene process, contiguous openings for the via and wiring line are formed in the single dielectric layer 22 and then a metal is deposited so as to simultaneously fill both openings to form the via 24 and wiring line 26. As the via 24 and wiring line 26 typically comprise Cu, the via 24 and wiring line 26 may be typically lined with a barrier layer (not shown) of a refractory metal or combination of refractory metals, such as TaN/Ta.

In the conventional methods of forming a dual damascene interconnect structure, the refractory barrier layer is on the sidewall and bottom of the trench and via. The refractory barrier layer is deposited thickly to ensure sufficient coverage of the refractory barrier layer which leads to high line resistance and high via resistance.

To resolve the problems of the prior art, the present inventors are proposing forming the trench and via as single damascene structures wherein only one of the trench structure or via structure contains the refractory barrier layer.

Figure 2A:
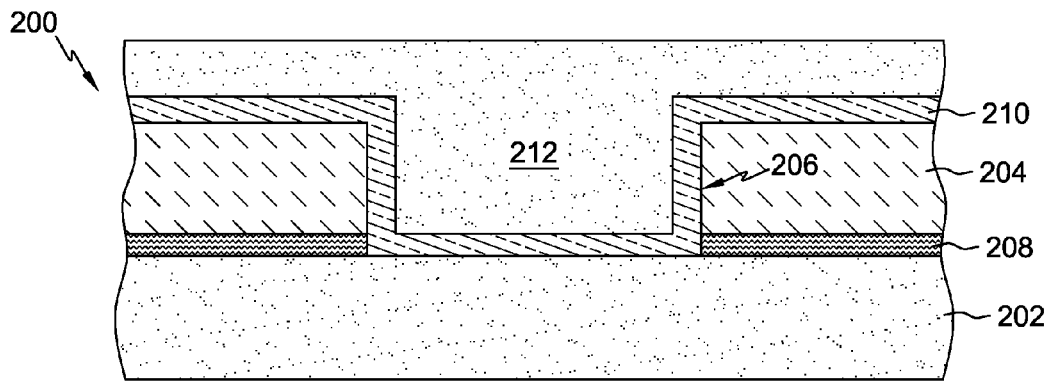
FIGS. 2A to 2C illustrate a first exemplary embodiment for forming a single damascene interconnect structure in which only the wiring line has a refractory metal barrier.
Figure 2B:
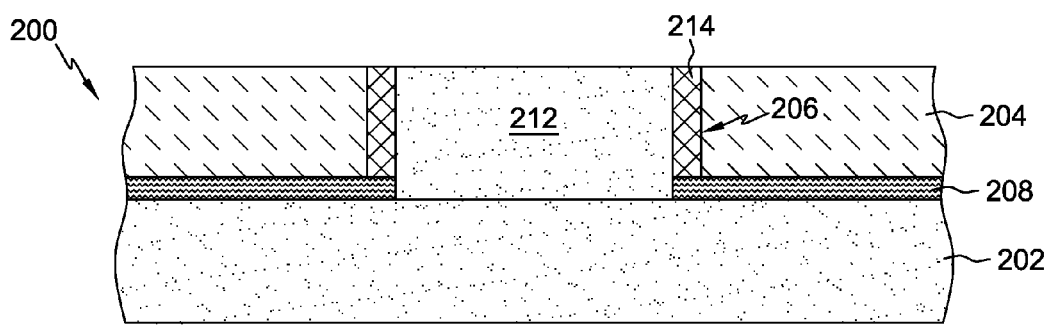
Figure 2C:
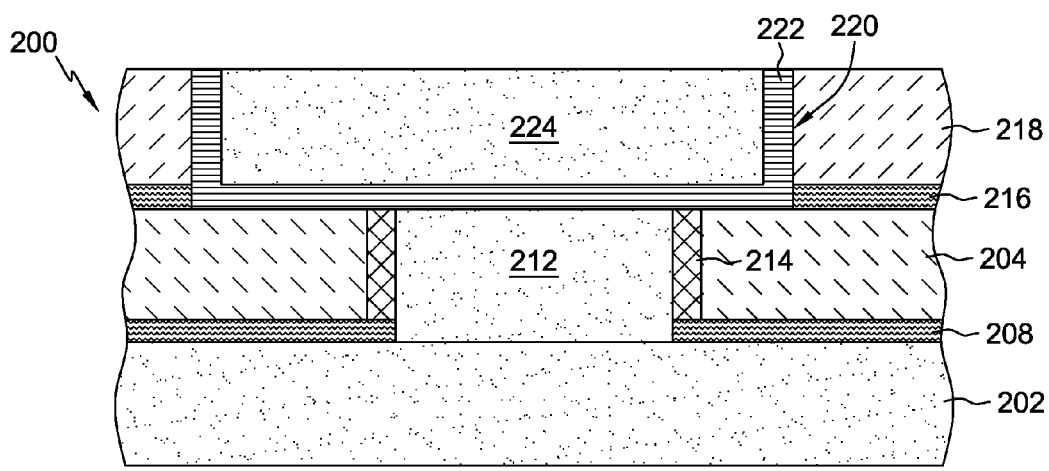

Referring now to FIGS. 2A to 2C, there is illustrated a first exemplary embodiment for forming an interconnect structure 200. Referring to FIG. 2A, there is dielectric layer 204 that has been formed on a wiring line 202 and then patterned to form a via opening 206. The dielectric layer 204 may be any Si-containing dielectric material, including low-k dielectric materials. Between the wiring line 202 and dielectric layer 204, there may be a metal capping layer 208, such as Co, and if the metal capping layer 208 is present, the opening 206 may extend through the metal capping layer 208 as well. Within the opening 206, there may be conformally-deposited a Cu(Mn) seed layer 210. The Cu(Mn) seed layer 210 may contain 0.5 to 15 atomic percent Mn with the remainder Cu, and may be approximately 5 to 50 nm thick. The remainder of the opening 206 may be filled with PVD (physical vapor deposited) or electroplated Cu 212 to form a via.

Thereafter, the interconnect structure 200 is planarized, such as by a chemical-mechanical polishing (CMP) process to remove the overburden of Cu(Mn) and Cu, leaving the Cu 212 that forms the via. The interconnect structure is then encapsulated with either a dielectric barrier material such as SiCNH or a stack of a metal capping layer such as Co and a dielectric barrier material such as SiCNH and then heated to 200° C. to 400° C. to cause the Mn to react with the Si and any residual O in the dielectric layer 204 to form a barrier 214 of Mn, Si, and O, such as MnSiO3, as shown in FIG. 2B. It is noted that the barrier 214 is only formed on the sidewalls of the via opening 206 where the Mn reacted with the Si and O in the dielectric layer 204. The barrier 214 also may be called a Self Forming Barrier (SFB). It is noted that the barrier 214 does not include any refractory barrier such as Ta, TaN, TiN, W, WN, Mo or MoN.

The via has thus been formed by a single damascene process. In a next process described with reference to FIG. 2C, a wiring line is formed also by a single damascene process. Dielectric layer 218 has been formed on dielectric layer 204, barrier 214 and Cu via 212. Dielectric layer 218 may be patterned to form a wiring line opening 220. The dielectric layer 218 may be any dielectric material, including low-k dielectric materials. Since a Mn-based barrier layer will not be used in the forming of the wiring line, it is not necessary for the dielectric material in dielectric layer 218 to be a Si-containing dielectric material although it usually will be. Between the dielectric layer 204 and dielectric layer 218, there may be a metal capping layer 216, such as Co, and if the metal capping layer 216 is present, the opening 220 may extend through the metal capping layer 216 as well.

Within the opening 220, there may be a refractory barrier 222 conformally deposited so as to line the sidewalls and bottom of the opening 220. For purposes of illustration and not limitation, the refractory barrier 222 may be a combination of Ta and TaN. Thereafter, Cu 224 may be deposited, for example by a PVD or electroplating process, to form a wiring line in opening 220. Thereafter, any overburden of Cu 224 and refractory barrier 222 may be removed by a planarization process, such as a CMP process, to result in the structure shown in FIG. 2C.

Figure 3A:
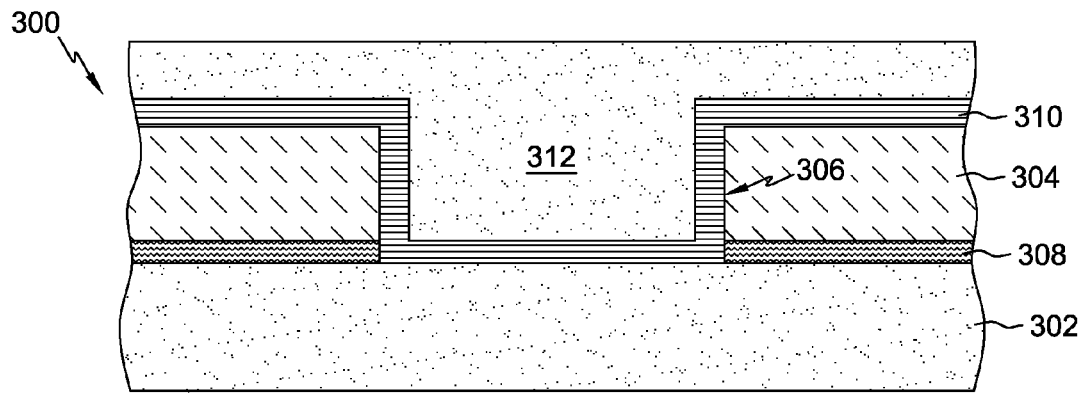
FIGS. 3A to 3C illustrate a second exemplary embodiment for forming a single damascene interconnect structure in which only the via has a refractory metal barrier.
Figure 3B:
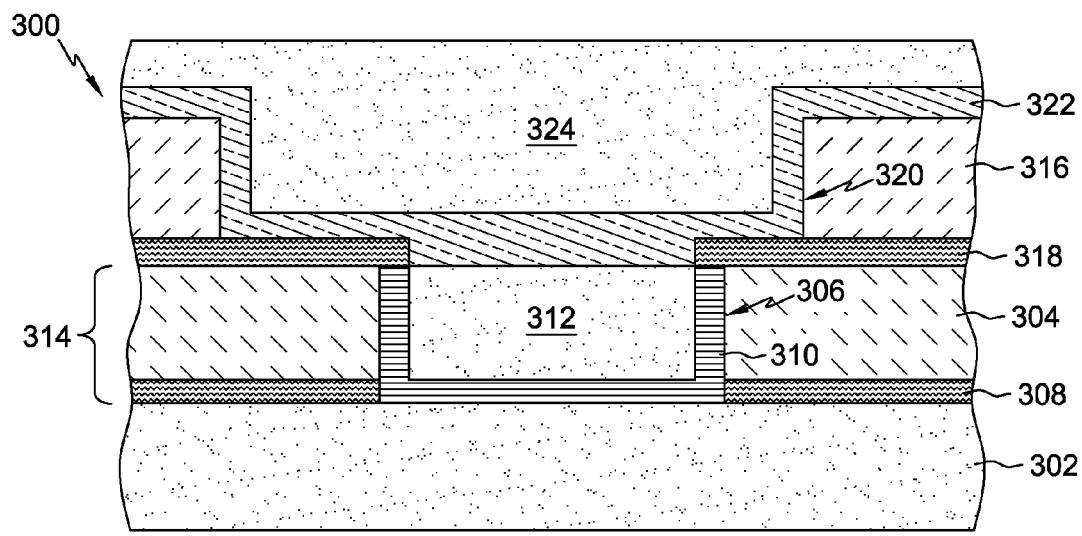
Figure 3C:
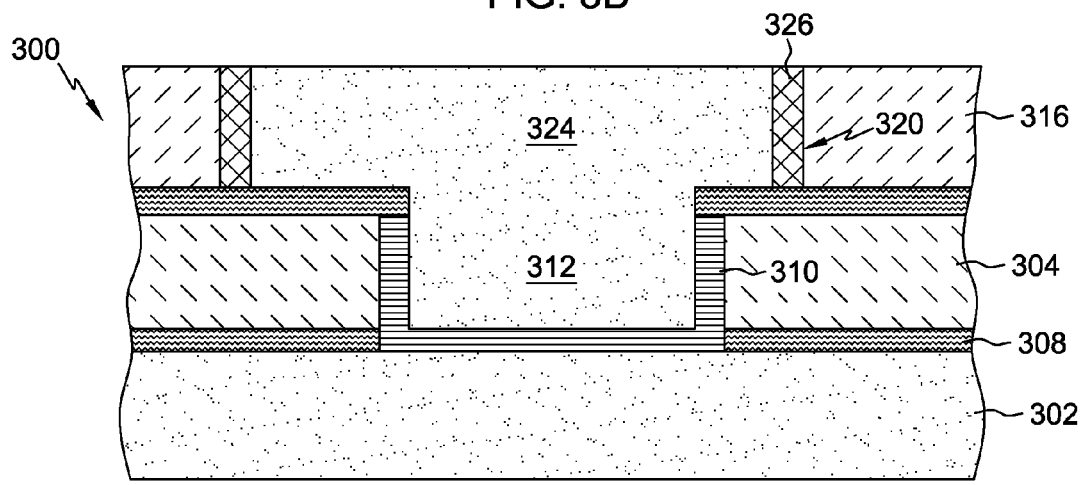

Referring now to FIGS. 3A to 3C, there is illustrated a second exemplary embodiment for forming an interconnect structure 300. Referring to FIG. 3A, there is dielectric layer 304 that has been formed on a wiring line 302 and then patterned to form a via opening 306. The dielectric layer 304 may be any dielectric material, including low-k dielectric materials. Between the wiring line 302 and dielectric layer 304, there may be a metal capping layer 308, such as Co, and if the metal capping layer 308 is present, the opening 306 may extend through the metal capping layer 308 as well. Within the opening 306, there may be a refractory barrier 310 conformally deposited so as to line the sidewalls and bottom of the opening 306. For purposes of illustration and not limitation, the refractory barrier 310 may be a combination of Ta and TaN. Thereafter, Cu 312 may be deposited, for example by a PVD or electroplating process, to form a via in opening 306. Any overburden of Cu 312 and refractory barrier 310 may be removed by a planarization process, such as a CMP process.

The single damascene structure to form the via is indicated by brackets 314 in FIG. 3B. In a next process described with reference to FIG. 3B, a wiring line is formed also by a single damascene process. Dielectric layer 316 has been formed on dielectric layer 304, refractory barrier 310 and Cu via 312. Dielectric layer 316 may be patterned to form a wiring line opening 320. The dielectric layer 316 may be any Si-containing dielectric material, including low-k dielectric materials. Between the dielectric layer 304 and dielectric layer 316, there may be a barrier layer 318, such as Co, and if the barrier layer 318 is present, the opening 320 may extend through the barrier layer 318 as well.

Within the opening 320, there may be conformally deposited a Cu(Mn) seed layer 322. The Cu(Mn) seed layer 322 may contain 0.5 to 15 atomic percent Mn, with the remainder Cu, and be approximately 5 to 50 nm thick. The remainder of the opening 320 may be filled with PVD or electroplated Cu 324 to form a wiring line.

Thereafter, the interconnect structure 300 may be planarized, such as by a CMP process to remove the overburden of Cu/Mn and Cu, leaving the Cu 324 that forms the wiring line. The interconnect structure is then encapsulated with either a dielectric barrier material such as SiCNH or a stack of a metal capping layer such as Co and a dielectric barrier material such as SiCNH and then heated to 200° C. to 400° C. to cause the Mn to react with the Si and any residual O in the dielectric layer 316 to form a SFB barrier 326 of Mn, Si and O, such as $MnSiO_3$, as shown in FIG. 3C. It is noted that the barrier 326 is only formed on the sidewalls of the wiring line opening 320 where the Mn reacted with the Si and O in the dielectric layer 316. Any excess of Mn that is not used in forming the barrier 326 is absorbed in the Cu wiring line 324. It is noted that the barrier 326 does not include any refractory barrier such as Ta, TaN, TiN, W, WN, Mo or MoN.

Figure 4A:
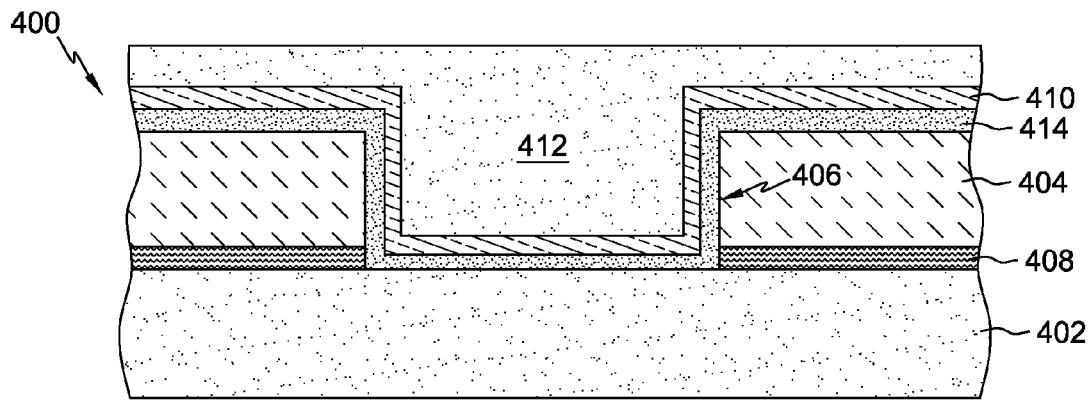
Figure 4B:
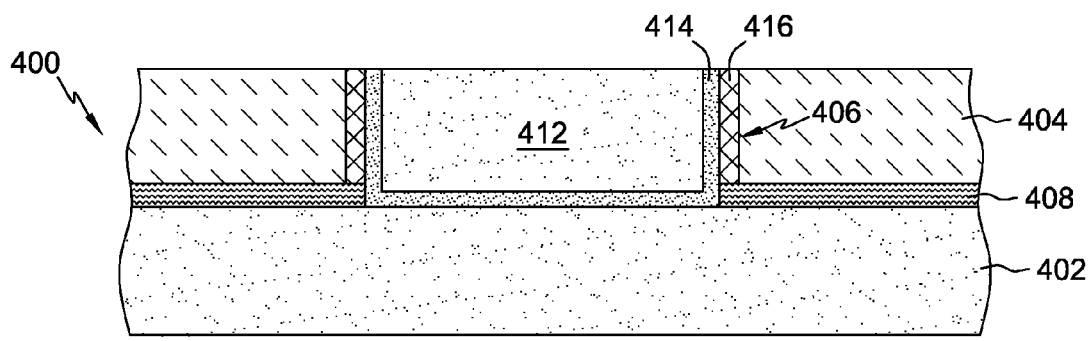
Figure 4C:
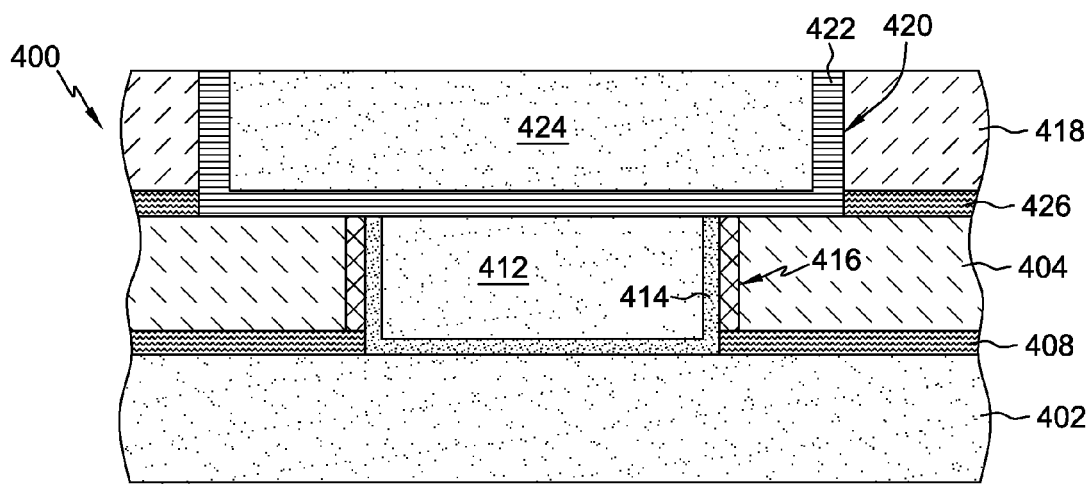

Referring now to FIGS. 4A to 4C, there is illustrated a third exemplary embodiment for forming an interconnect structure 400. Referring to FIG. 4A, there is dielectric layer 404 that has been formed on a wiring line 402 and then patterned to form a via opening 406. The dielectric layer 404 may be any Si-containing dielectric material, including low-k dielectric materials. Between the wiring line 402 and dielectric layer 404, there may be a metal capping layer 408, such as Co, and if the metal capping layer 408 is present, the opening 406 may extend through the metal capping layer 408 as well. Within the opening 406, there may be conformally deposited a Co layer 414, approximately 1 to 10 nm thick followed by conformal deposition of a Cu(Mn) seed layer 410. The Cu(Mn) seed layer 410 may contain 0.5 to 15 atomic percent Mn, remainder Cu and be approximately 5 to 50 nm thick. The remainder of the opening 406 may be filled with PVD or electroplated Cu 412 to form a via.

Thereafter, the interconnect structure 400 is planarized, such as by a CMP process to remove the overburden of Co, Cu/Mn and Cu, leaving the Cu 412 that forms the via. The interconnect structure may then be encapsulated with either a dielectric barrier material such as SiCNH or a stack of a metal capping layer such as Co and a dielectric barrier material such as SiCNH and then heated to 200° C. to 400° C. to cause the Mn to diffuse through the Co to react with the Si and any residual O in the dielectric layer 404 to form an SFB barrier 416 of Mn, Si and O, such as MnSiO3, as shown in FIG. 4B. It is noted that the barrier 416 is only formed on the sidewalls of the via opening 406 where the Mn reacted with the Si and O in the dielectric layer 404. It is noted that the barrier 416 does not include any refractory barrier such as Ta, TaN, TiN, W, WN, Mo, MoN.

The via has thus been formed by a single damascene process. In a next process described with reference to FIG. 4C, a wiring line is formed also by a single damascene process. Dielectric layer 418 has been formed on dielectric layer 404, barrier 416, Co layer 414 and Cu via 412. Dielectric layer 418 may be patterned to form a wiring line opening 420. The dielectric layer 418 may be any dielectric material, including low-k dielectric materials. Since a Mn barrier layer will not be used in the forming of the wiring line, it is not necessary for the dielectric material in dielectric layer 418 to be a Si-containing dielectric material although it usually will be. Between the dielectric layer 404 and dielectric layer 418, there may be a metal capping layer 426, such as Co, and if the metal capping layer 426 is present, the opening 420 may extend through the metal capping layer 426 as well.

Within the opening 420, there may be a refractory barrier 422 conformally deposited so as to line the sidewalls and bottom of the opening 420. For purposes of illustration and not limitation, the refractory barrier 422 may be a combination of Ta and TaN. Thereafter, Cu 424 may be deposited, for example by a PVD or electroplating process, to form a wiring line in opening 420. Thereafter, any overburden of Cu 424 and refractory barrier 422 may be removed by a planarization process, such as a CMP process, to result in the structure shown in FIG. 4C.

Figure 5A:
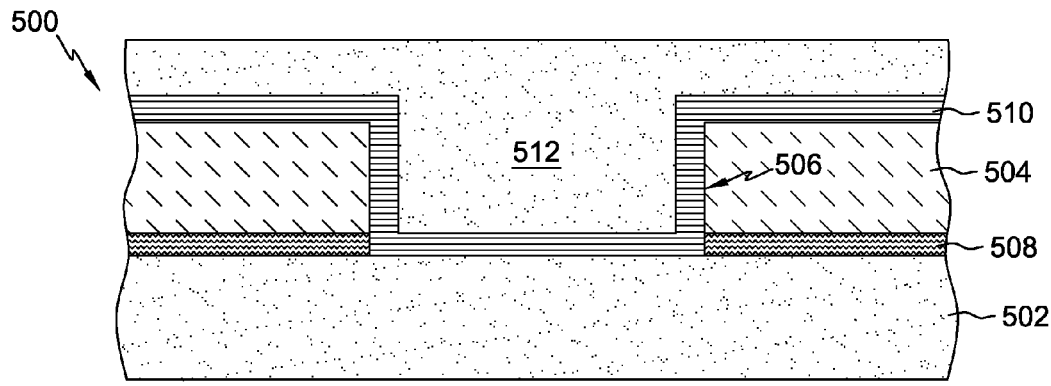
Figure 5B:
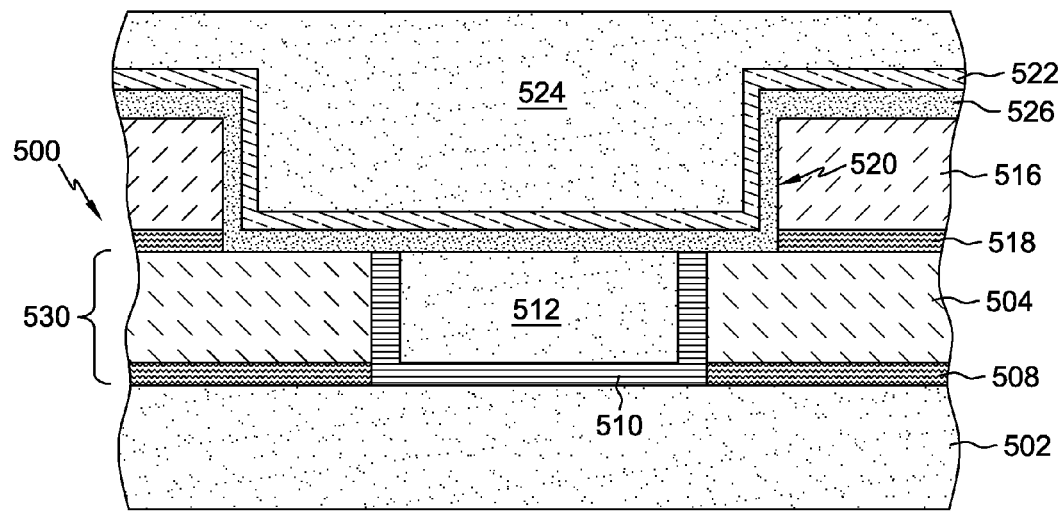
Figure 5C:
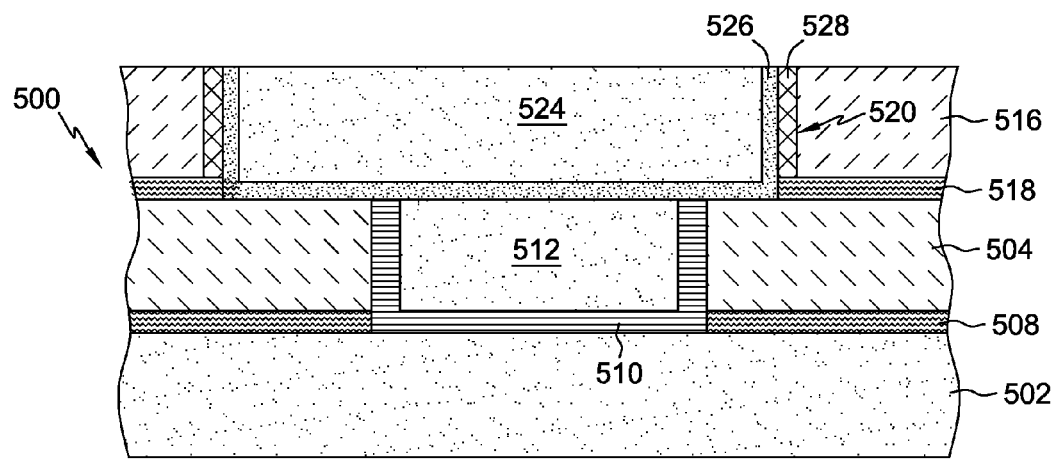

Referring now to FIGS. 5A to 5C, there is illustrated a fourth exemplary embodiment for forming an interconnect structure 500. Referring to FIG. 5A, there is dielectric layer 504 that has been formed on a wiring line 502 and then patterned to form a via opening 506. The dielectric layer 504 may be any dielectric material, including low-k dielectric materials. Between the wiring line 502 and dielectric layer 504, there may be a metal capping layer 508, such as Co, and if the metal capping layer 508 is present, the opening 506 may extend through the metal capping layer 508 as well.

Within the opening 506, there may be a refractory barrier 510 conformally deposited so as to line the sidewalls and bottom of the opening 506. For purposes of illustration and not limitation, the refractory barrier 510 may be a combination of Ta and TaN. Thereafter, Cu 512 may be deposited, for example by a PVD or electroplating process, to form a via in opening 506. Any overburden of Cu 512 and refractory barrier 510 may be removed by a planarization process, such as a CMP process.

The single damascene structure to form the via is indicated by brackets 530 in FIG. 5B In a next process described with reference to FIG. 5B, a wiring line is formed also by a single damascene process. Dielectric layer 516 has been formed on dielectric layer 504, refractory barrier 510 and Cu via 512. Dielectric layer 516 may be patterned to form a wiring line opening 520. The dielectric layer 516 may be any Si-containing dielectric material, including low-k dielectric materials. Between the dielectric layer 504 and dielectric layer 516, there may be a metal capping layer 518, such as Co, and if the metal capping layer 518 is present, the opening 520 may extend through the metal capping layer 518 as well.

Within the opening 520, there may be conformally deposited a Co layer 526 followed by deposition of a Cu(Mn) seed layer 522. The Cu(Mn) seed layer 522 may contain 0.5 to 15 atomic percent Mn, remainder Cu and be approximately 5 to 50 nm thick. The remainder of the opening 520 may be filled with PVD or electroplated Cu 524 to form a wiring line.

Thereafter, the interconnect structure 500 may be planarized, such as by a CMP process to remove the overburden of Cu(Mn) and Cu, leaving the Cu 524 that forms the wiring line. The interconnect structure may then be encapsulated with either a dielectric barrier material such as SiCNH or a stack of a metal capping layer such as Co and a dielectric barrier material such as SiCNH and then heated to 200° C. to 400° C. to cause the Mn to diffuse through the Co layer 526 and react with the Si and any residual O in the dielectric layer 516 to form an SFB barrier 528 of Mn, Si and O, such as MnSiO3, as shown in FIG. 5C. It is noted that the barrier 528 is only formed on the sidewalls of the via opening 520 where the Mn reacted with the Si and O in the dielectric layer 516. Any excess of Mn that is not used in forming the barrier 528 is absorbed in the Cu via 524. It is noted that the barrier 528 does not include any refractory barrier such as Ta, TaN, TiN, W, WN, Mo or MoN.

In all of the foregoing embodiments, the via and wiring line have been formed by single damascene processes in which only one of the via and wiring line has a refractory metal barrier and the other of the via and wiring line does not have a refractory metal barrier but instead has a Mn(Si, O) barrier. Mn is not considered to be a refractory metal. It is desirable to have the Mn(Si, O) barrier to reduce line or via resistance and the refractory metal barrier to alleviate electromigration. Further, by needing the refractory metal barrier in only one of the via and wiring line, the thickness of the refractory metal barrier may be more easily tuned for optimum thickness.

Figure 6:
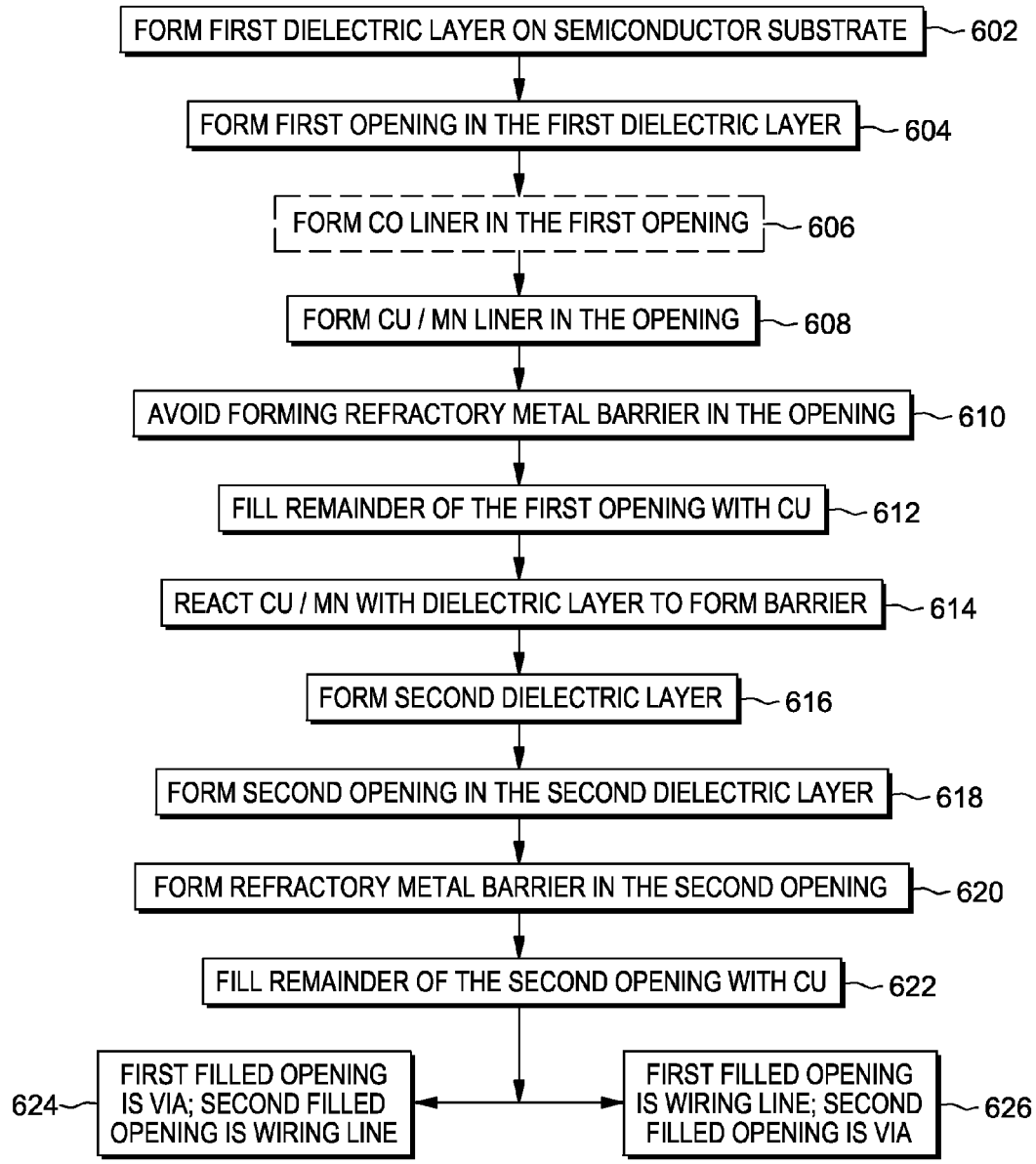
FIG. 6 illustrates a method of the exemplary embodiments for forming a single damascene interconnect structure.

A process for fabricating the single damascene interconnect structure exemplary embodiments is illustrated in FIG. 6. A first dielectric layer is formed on a semiconductor substrate, box 602. A first opening is then formed in the first dielectric layer, box 604. In an optional process, a Co liner on a sidewall and bottom may be formed, box 606. Thereafter, a layer of Cu(Mn) alloy is deposited on a sidewall and a bottom of the opening, box 608. If the Co is present, the Cu(Mn) alloy may be deposited directly on the Co liner. Since the Cu(Mn) alloy will form a barrier due to its reaction with the dielectric, the forming of a refractory barrier in the opening may be avoided, box 610. The remainder of the opening (not filled with the Cu(Mn) alloy and the Co) may be filled with Cu, box 612. The Cu(Mn) alloy is then reacted (by heating) with the dielectric layer to form a barrier layer including Mn, O and Si, box 614. Then, a second dielectric layer may be formed on the semiconductor substrate, box 616. A second opening may be formed in the second dielectric layer, box 618. A refractory barrier layer is formed on a sidewall and bottom of the second opening, box 620, followed by filling the remainder of the opening with Cu, box 622. The first dielectric layer is directly adjacent to the second dielectric layer and the first filled opening is aligned with the second filled opening so as to form a via and wiring line arrangement. The process may be varied so that one of the first filled opening and second filled opening is a via and the other of the first filled opening and second filled opening is a trench. That is, the first opening filled with Cu may be a via and the second opening filled with Cu may be a wiring line, box 624. Alternatively, the first opening filled with Cu may be a wiring line and the second opening filled with Cu may be a via, box 626.

In all of the preceding exemplary embodiments, Mn in conjunction with Si and O from the dielectric have been used to form the SFB. Although Mn is the preferred metal for the SFB, it is within the scope of the present invention to use Ti or Al in conjunction with Si and O for the SFB.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A single damascene interconnect structure comprising:
a first layer comprising a first dielectric material having a first filled opening, the first filled opening having a sidewall refractory barrier layer and a bottom refractory barrier layer, the sidewall refractory barrier layer being in direct contact with the first dielectric material, with Cu filling a remainder of the first filled opening;
a second layer comprising a second dielectric material having a second filled opening, the second opening having a sidewall layer comprising a compound of a metal, O and Si such that the metal is selected from the group consisting of Mn, Ti and Al, a bottom layer in contact with the first dielectric material devoid of the compound of the metal, O and Si and Cu filling a remainder of the second filled opening, wherein the compound of the metal, O and Si is in direct contact with the second dielectric material;
the first layer adjacent to the second layer and the first filled opening being aligned with the second filled opening so that the first filled opening is a via and the second filled opening is a trench.

2. The structure of claim 1 further comprising the second filled opening having a sidewall layer of Co between the sidewall layer comprising the compound of the metal, O and Si and the Cu filler in the second filled opening and further comprising the bottom layer is Co underneath the Cu filler in the second filled opening.

3. The structure of claim 1 wherein the Cu filler of the first filled opening is in direct contact with the Cu filler of the second filled opening.

4. The structure of claim 1 wherein the metal is Mn.

5. The structure of claim 1 wherein the first layer is devoid of the compound of the metal, O and Si.

6. The structure of claim 1 wherein the sidewall layer comprising the compound of the metal, O and Si is a self forming barrier layer.

7. A single damascene interconnect structure comprising:
a first layer comprising a first dielectric material having a first filled opening, the first opening having a sidewall barrier layer in direct contact with the first dielectric material and a bottom barrier layer, the sidewall barrier layer and the bottom barrier layer selected from the group consisting of TaN, Ta, W, WN, Mo and MoN, with Cu filling a remainder of the first filled opening;
a second layer comprising a second dielectric material having a second filled opening, the second filled opening having a sidewall layer in direct contact with the second dielectric material and comprising a compound of a metal, O and Si such that the metal is selected from the group consisting of Mn, Ti and Al, a Co layer on the compound of the metal, O and Si and also Co comprising a bottom layer of the second filled opening, the bottom layer in contact with the first dielectric material and devoid of the compound of the metal, O and Si and Cu filling a remainder of the second filled opening;
the first layer adjacent to the second layer and the first filled opening being aligned with the second filled opening so that the first filled opening is a via and the second filled opening is a trench.

8. A method of forming a single damascene interconnect structure comprising:
forming a first dielectric layer on a semiconductor substrate;
forming a first opening in the first dielectric layer;
forming a refractory barrier layer directly on a sidewall and a bottom of the first opening;
filling a remainder of the first opening with Cu to form a first filled opening;
forming a second dielectric layer on the semiconductor substrate;
forming a second opening in the second dielectric layer;

depositing a layer of a Cu(metal) alloy on a sidewall and a bottom of the second opening wherein the metal is selected from the group consisting of Mn, Ti and Al;

filing a remainder of the second opening with Cu to form a second filled opening;

reacting the Cu(metal) alloy only with the second dielectric layer to form a barrier layer comprising metal, O, and Si only on the sidewall of the second filled opening;

wherein the first dielectric layer adjacent to the second dielectric layer and the first filled opening being aligned with the second filled opening so that the first filled opening is a via and the second filled opening is a trench.

9. The method of claim 8 wherein the metal is Mn.

10. The method of claim 8 wherein between the steps of forming a second opening in the second dielectric layer and depositing the layer of the Cu(metal) alloy, further comprising depositing a layer of Co on the sidewall and the bottom of the second opening and wherein the depositing the layer of the Cu(metal) alloy is depositing directly on the Co layer.

11. The method of claim 8 wherein the Cu filler of the first opening is in direct contact with the Cu filler of the second opening.

12. The method of claim 8 wherein the first opening is devoid of the barrier layer comprising the metal, O, and Si.

13. The method of claim 8 wherein the barrier layer comprising the metal, O, and Si is a self forming barrier layer.

14. The method of claim 8 wherein the Cu(metal) alloy comprises 0.5 to 15 atomic percent metal, remainder Cu.

* * * * *